(12) United States Patent
Reichmanis et al.

(10) Patent No.: US 7,008,757 B2
(45) Date of Patent: Mar. 7, 2006

(54) PATTERNED STRUCTURES OF HIGH REFRACTIVE INDEX MATERIALS

(75) Inventors: Elsa Reichmanis, Westfield, NJ (US); Shu Yang, North Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 267 days.

(21) Appl. No.: 10/321,027

(22) Filed: Dec. 17, 2002

(65) Prior Publication Data

US 2004/0115566 A1 Jun. 17, 2004

(51) Int. Cl.
G03F 7/20 (2006.01)
(52) U.S. Cl. .................................. 430/322; 430/328
(58) Field of Classification Search ................ 430/311, 430/314, 321, 322, 328, 329
See application file for complete search history.

(56) References Cited

U.S. PATENT DOCUMENTS

| | | | | |
|---|---|---|---|---|
| 5,239,412 A | * | 8/1993 | Naka et al. ................. | 359/619 |
| 5,248,734 A | | 9/1993 | Ober et al. ............... | 525/328.8 |
| 5,324,623 A | * | 6/1994 | Tsumori ..................... | 430/321 |
| 5,348,687 A | | 9/1994 | Beck et al. ................. | 252/582 |
| 5,665,527 A | * | 9/1997 | Allen et al. ................. | 430/325 |
| 5,922,299 A | | 7/1999 | Bruinsma et al. ........... | 423/335 |
| 5,948,470 A | | 9/1999 | Harrison et al. ............ | 427/198 |
| 6,027,666 A | | 2/2000 | Ozin et al. ............ | 252/301.4 R |
| 6,042,998 A | * | 3/2000 | Brueck et al. .............. | 430/323 |
| 6,136,505 A | * | 10/2000 | Tanabe et al. ........... | 430/273.1 |
| 6,319,427 B1 | | 11/2001 | Ozin et al. ............ | 252/301.4 R |
| 6,329,070 B1 | | 12/2001 | Sass et al. ................... | 428/612 |
| 6,379,874 B1 | * | 4/2002 | Ober et al. ................. | 430/322 |
| 6,387,453 B1 | | 5/2002 | Brinker et al. .............. | 427/387 |
| 6,409,907 B1 | | 6/2002 | Braun et al. ................ | 205/317 |
| 6,465,387 B1 | | 10/2002 | Pinnavaia et al. .......... | 502/158 |
| 6,471,761 B1 | | 10/2002 | Fan et al. .............. | 106/287.16 |
| 2004/0023150 A1 | * | 2/2004 | Feiring et al. .............. | 430/325 |

FOREIGN PATENT DOCUMENTS

| WO | WO 01/31404 A1 | 5/2001 |
|---|---|---|
| WO | WO 01/42540 A1 | 6/2001 |
| WO | WO 01/51990 A1 | 7/2001 |

OTHER PUBLICATIONS

U.S. Appl. No. 10/040,017, filed Jan. 4, 2002, Megenset et al.
U.S. Appl. No. 10/098,286, filed Mar. 15, 2002, C.H. Chen et al.
Sundararajan, N., et al., "Supercritical $CO_2$ Processing for Submicron Imaging of Fluoropolymers," *Chemistry of Materials*, vol. 12, No. 1, Jan. 2000, pps. 41-48.
A.J. Turberfield, "Photonic Crystals Made By Holographic Lithography", MRS. Bulletin, Aug. 2001, pp. 632-636.
M. Campbell, et al., "Fabrication Of Photonic Crystals For The Visible Spectrum By Holographic Lithography," Nature, vol. 404, Mar. 2, 2000, pp. 53-56.
K.M. Ho, et al., "Existence Of A Photonic Gap In Periodic Dielectric Structures," Physical Review Letters, vol. 65, No. 25, Dec. 17, 1990, pp. 3152-3155.
E. Ozbay, et al., "Measurement Of A Three-Dimensional Photonic Band Gap In A Crystal Structure Made Of Dielectric Rods," Physical Review B, vol. 50, No. 3, Jul. 15, 1994, pp. 1945-1948.
A Tuberfield, "Photonic Crystals Made By Holographic Lithography" ABSTRACT from Symposium K, Microphotonics-Materials, Physics, and Applications, Nov. 26-29, 2001.
S. Shoji et al., "Photofabrication Of Three-Dimensional Photonic Crystals By Multibeam Laser Interference into A Photopolymerizable Resin," Applied Physics Letters, vol. 76, No. 19, May 8, 2000, pp. 2668-2670.
Kresge, C.T., et al: "Ordered mesoporous molecular sieves synthesized by a liquid-crystal template mechanism" NATURE, vol. 359, Oct., 1992, pp. 710-712.
Tanev, Peter T., et al: "A Neutral Templating Route to Mesaporous Molecular Sieves," SCIENCE, vol. 267, Feb., 1995, pp. 865-866.
Huo, Q. et al.: "Generalized synthesis of periodic surfactant/inorganic composite materials," NATURE, vol. 368, Mar., 1994, pp. 317-321.
Sanchez, C., et al: "Design and Properties of Hybrid Organic-Inorganic Nanocomposites for Photonics," MRS Bulletin, May, 2001, pp. 377-387.
Yang, P., et al: "Hierarchically Ordered Oxides," Science, vol. 282, Dec., 1998, pp. 2244-2246.
Templin, M. et al: "Organically Modified Aluminosilicate Mesostructures from Block Copolymer Phases," Science, vol. 278, Dec., 1997, pp. 1795-1798.
Raman, N.K., et al: "Template-Based Approaches to the Preparation of Amorphous, Nanoporous Silicas," Chemical Matter, vol. 8, Feb., 1996, pp. 1682-1701.
Yang, P., et al: "Block Copolymer Templating Syntheses of Mesoporous Metal Oxides with Large Ordreing Lengths and Semicrystalline Framework," Chemical Matter, vol. 11, 1999, pp. 2813-2826.

(Continued)

*Primary Examiner*—Kathleen Duda
(74) *Attorney, Agent, or Firm*—John F McCabe

(57) ABSTRACT

A process for forming a polymer template includes exposing a photoresist having polymer molecules to a light pattern and baking the photoresist to chemically react polymer molecules in portions of the photoresist that were exposed to light of the light pattern. The reacted polymer molecules have a different solubility in a solvent than chemically unreacted polymer molecules. The process also includes washing the baked photoresist with the solvent to produce a porous structure by selectively solvating one of the reacted polymer molecules and the unreacted polymer molecules. The porous structure can be used as template for forming porous structures of high refractive index materials.

12 Claims, 7 Drawing Sheets

OTHER PUBLICATIONS

Brinker, C.J., et al., "Evaporation-Induced Self-Assembly: Nanostructures Made Easy**" Advanced Materials, vol. 11, 1999, pp. 579-585.

U.S. Appl. No. 10/383,150, filed Mar. 6, 2003, Chen et al.

Zhang, S., et al., "Materials and techniques for electrochemical biosensor design and construction," Biosensors & Bioelectronics 15, (2000), pp. 273-282.

Wu, H., et al., "Reduction Photolithography Using Microlens Arrays: Applications in Gray Scale Photolithography," Analytical Chemistry, vol. 74, No. 14, Jul. 15, 2002, pp. 3267-3273.

Leister Microsystems, leaflet by Leister Microsystems entitled, "Micro-optics—Imagine the Future of Light," Sep. 2001, 4 pages.

Stokes, D.L., et al., "Detection of E. coli using a microfluidics-based Antibody Biochip detection systems," Fresenius, J. Anal Chem 369, (2001), pp. 295-301.

Jahns, J., et al., "Microoptics for biomedical applications," American Biotechnology Laboratory, No. 18, Oct. 2000, pp. 52 and 54.

Campbell, D.J., et al., "Replication and Compression of Bulk and Surface Structures with Pholydimethylsiloxane Elastomer," Journal of Chemical Education, vol. 76, No. 4, Apr. 1999, pp. 537-541.

Kruk, M., "Mesoporous Silicate-Surfactant Composites with Hydrophobic Surfaces and Tailored Pore Sizes"; Journal of Physical Chemistry B, 106, (Aug. 29, 2002) 10096.

Avgeropoulos, et al., "Synthesis and Morphological Behavior of Silicon-Containing Triblock Copolymers for Nonostructure Applications," Chem. Mater., 10, Jul. 22, 1998, pp. 2109-2115.

Chan, Vanessa Z.-H., et al., "Ordered Bicontinuous Nanoporous and Nanorelief Ceramic Films from Self Assembling Polymer Precursors," Science, Nov. 26, 1999, vol. 286, pp. 1716-1719.

Shishido, A., et al., "Direct fabrication of two-dimensional titania arrays using interference photolithography," Applied Physical Letters, vol. 79, No. 20, Nov. 12, 2001, pp. 3332-3334.

Thrush, E., et al., "Integrated semiconductor fluorescent detection system for biochip and biomedical applications," IEEE-EMBS Special Topic Conference on Microtechnologies in Medicine & Biology, May 2002, pp. 374-379.

Young, "Organic-Inorganic Monomers," online publication at http://www.psrc.unm.edu/mauritz/nano2.html, Jul. 8, 2002, 4 pages.

Tang, et al., "Creating Periodic Three-Dimensional Structures by Multibeam Interference of Visible Laser," Chemistry of Materials, vol. 14, No. 7, Jul. 2002, pp. 2831-2833.

Vlasov et al., "On-Chip Natural Assembly of Silicon Photonic Bandgap Crystals," Nature, vol. 414, Nov. 15, 2001, pp. 289-293.

Baney, et al., "Silsesquioxanes," American Chemical Society, 1995, pp. 1409-1430.

The Wittman Company, "Carbon Dioxide," online publication at http://www.witteman.com/co2.htm, Dec. 4, 2002, 2 pages.

"Sol-Gel Chemistry," online publication at http://www.sol-gel.com/chemi.htm, Dec. 9, 2002, 2 pages.

* cited by examiner

US 7,008,757 B2

PATTERNED STRUCTURES OF HIGH REFRACTIVE INDEX MATERIALS

BACKGROUND OF THE INVENTION

1. Field of the Invention

The invention relates to structures with artificially patterned refractive indexes.

2. Discussion of the Related Art

A photonic crystal is a material with a refractive index that varies periodically. In a photonic crystal, the optical response results from a coherent superposition of optical waves propagating therein. Photonic crystals with sufficiently high refractive index contrasts, e.g., a contrast of more than 2, exhibit complete photonic bandgaps. A photonic bandgap prohibits electromagnetic waves from propagating in such a crystal for wave vectors at optical wavelengths.

Herein, a photonic crystal with a complete photonic bandgap will be referred to as a photonic bandgap structure. Photonic bandgap structures have applications in a variety of optical devices. Thus, processes for fabricating such structures are useful.

One process for fabricating a photonic bandgap structure involves producing a periodic array of voids in a base material. In such a void-filled photonic bandgap structure, the refractive index pattern has a high contrast if the base material has a high refractive index.

Fabricating a void-filled structure from a material with a high refractive index typically involves a multi-step template-based process. First, a reaction step produces a template with a periodic array of voids therein. Second, a fill step introduces a material with a high refractive index into the voids of the template. Third, a removal step eliminates the template material from the filled structure to produce a porous structure of the high refractive index material alone.

Such template-based fabrication processes need to account for the properties of both the template material and the filling material. In particular, the filling step must not damage the template material, and the removal step must not damage the filling material. Unfortunately, many photoresists do not withstand the process of being filled with a material having a high refractive index. Similarly, many high refractive index materials do not withstand the treatments for removing templates made of photoresists.

BRIEF SUMMARY

Various embodiments provide polymer templates and processes for fabricating the polymer templates. The polymer templates enable fabrication of porous structures from materials with high refractive indexes. In particular, the template material is compatible with being filled with a high refractive index material, and removal of the template material from the resulting structure is possible without damaging the high refractive index material. Both the filling and removal steps are typically performed at low temperatures to avoid damage to the various materials.

In one aspect, a process includes exposing a photoresist including polymer molecules to a light pattern and baking the photoresist to make ones of the polymer molecules that were exposed to light of the pattern less soluble in a solvent. The process includes reacting the baked photoresist with a reagent to make the ones of the polymer molecules more soluble in the solvent and re-exposing the photoresist to light and rebaking the photoresist to make others of the polymer molecules that were not exposed to light of the pattern less soluble in the solvent. The process includes washing the baked photoresist with the solvent to produce voids in the baked photoresist by selectively solvating the ones of the polymer molecules that were exposed to light of the pattern.

In another aspect, a process includes exposing a photoresist comprising polymer molecules to a light pattern and baking the photoresist to chemically react ones of the polymer molecules that were exposed to light of the light pattern. The reacted ones of the polymer molecules have a different solubility in a solvent than chemically unreacted ones of the polymer molecules. The process includes washing the baked photoresist with the solvent to produce voids in the baked photoresist by selectively solvating the reacted ones of the polymer molecules or the unreacted ones of the polymer molecules. The process includes filling the voids with a material to produce a filled structure. The material has a refractive index of more than two.

Herein, various processes involving exposure of a material to a light pattern with light and dark regions produce a void-filled structure. The resulting structures are referred to as positive tone structures if the voids occupy regions that were exposed to light regions of the light pattern. The resulting structures are referred to as negative tone structures if the voids occupy regions that were dark regions of the light pattern.

BRIEF DESCRIPTION OF THE DRAWINGS

In the various Figures, like reference numbers indicate elements with similar functions.

DETAILED DESCRIPTION OF ILLUSTRATIVE EMBODIMENTS

Figure 1:
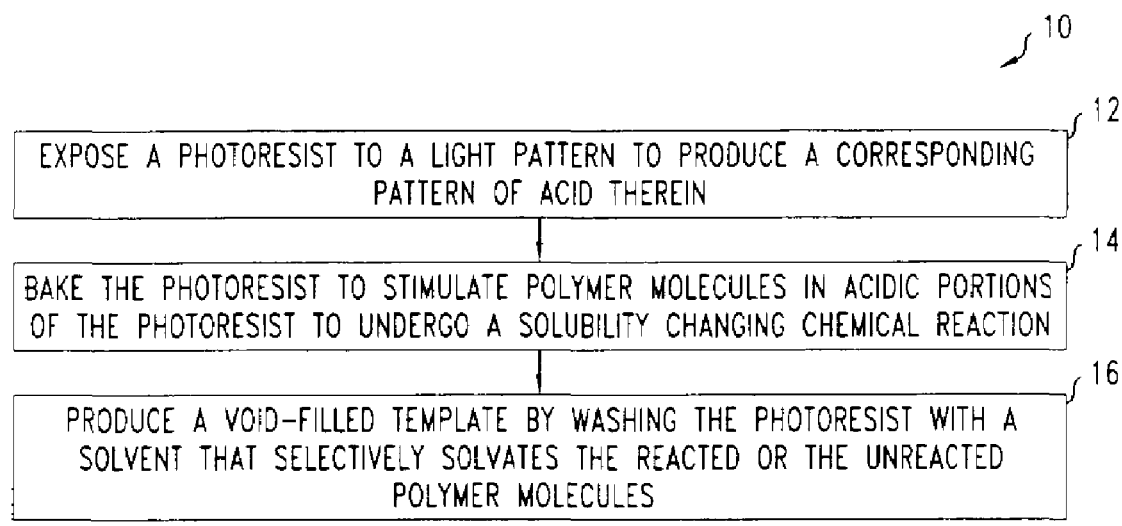
FIG. 1 is flow chart showing a process for fabricating a porous template of non-crosslinked polymer molecules.

FIG. 1 illustrates a process 10 for fabricating a template from a polymer photoresist. The template is a homogeneous material of non-crosslinked polymer molecules with a pattern of voids therein. The voids of exemplary templates form periodic patterns in one-, two-, or three-dimensions.

The process 10 includes exposing a slab of photoresist to a light pattern to produce a corresponding pattern of acid in the photoresist (step 12). The photoresist is a homogenous mixture of polymer molecules, dye molecules, and photoacid generator molecules. The light of the exposure causes the photo-acid generator molecules to produce acid, i.e., hydronium ions ($H^+$). The distribution of $H^+$ ions corresponds to the light intensity pattern during the exposure.

Herein, a light pattern includes both an array of dark regions and an array of light regions. Exemplary light patterns are periodic in one, two, or three dimensions and have periods of about 0.1 microns and about 10 microns, i.e., mesoscopic scale periods suitable for photonic bandgap structures at telecommunications wavelengths. Such periodic light patterns result from interfering two, three, or four mutually coherent light beams. Processes for producing such light patterns are described in pending U.S. patent application Ser. No. 10/040,017, filed Jan. 4, 2002, ('017), which is incorporated herein by reference in its entirety.

The light exposure does not stimulate chemical reactions that significantly change the refractive index of the photoresist. In particular, the photochemical reactions do not polymerize, decompose, or crosslink molecules in the photoresist. Instead, the photochemical reactions produce acid, which does not significantly change the refractive index. The absence of refractive index changes insures that the light patterning will not lead to material changes that feedback and could otherwise interfere with the acid pattern formed in the photoresist. The final acid distribution forms a pattern that corresponds to the light pattern used to expose the photoresist.

The process 10 includes baking the exposed photoresist to cause polymer molecules, which are located in regions exposed by the light, to undergo a solubility change (step 14). In some embodiments, the solubility change results from generation of polar groups on the polymer molecules. In other embodiments, the solubility change results from generation of nonpolar groups on the polymer molecules. The new groups are generated by a heat-induced reaction of polymer molecules that are located in portions of the photoresist where acid was generated during the light patterning. The acid catalyzes the reaction.

The bake step proceeds at a temperature that is above the glass transition temperature of the organic polymer molecules of the photoresist and is lower than the decomposition temperature for the molecules. Exemplary bake temperatures for polymer resists are below about 350° C. and are preferably below about 200° C.

Various embodiments of the process 10 use a photoresist whose polymer molecules are initially soluble in a nonpolar solvent. For polymer molecules initially soluble in a nonpolar solvent, the acid-catalyzed reaction produces polymer molecules with more polar functional groups. The reacted polymer molecules are thus, less soluble in the nonpolar solvent and more soluble in polar solvents. After the bake, the photoresist includes a pattern of polymer molecule solubility type that tracks the light pattern used during the exposure at step 12.

In some embodiments, further chemical treatments invert the solubilities of polymer molecules located in respective light and dark regions of the light pattern as described below.

The process 10 also includes washing the baked photoresist with solvent to produce voids therein by selectively dissolving away polymer molecules of one solubility type (step 16). Exemplary washes use a nonpolar liquid as the solvent. In such solvents, the unreacted and reacted polymer molecules of the baked photoresist have different solubilities. For that reason, the wash generates a pattern of voids that tracks the light pattern originally used to expose the photoresist. The resulting void-filled photoresist is a polymer template.

To enable the wash to produce voids, the conditions of the bake are selected to not crosslink polymer molecules. Crosslinking would significantly lower solubilities of the polymer molecules and would impede a solvent from removing the polymer template after subsequent filling with high index materials.

Figure 2:
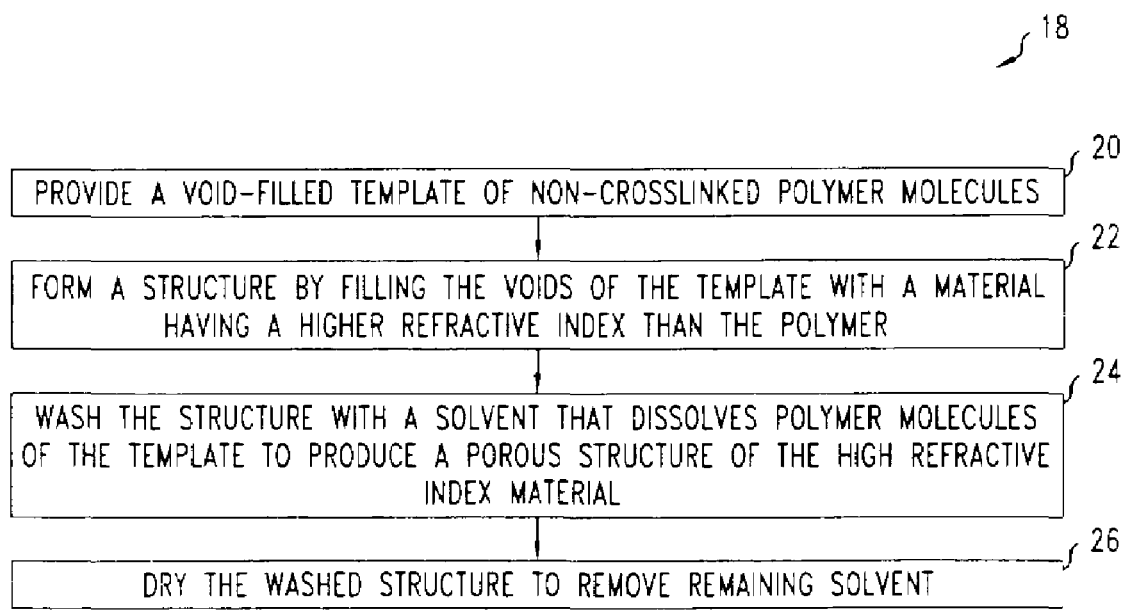
FIG. 2 is flow chart showing a process for fabricating a porous structure of a of a high refractive index material from the template of FIG. 1.

FIG. 2 illustrates a process 18 for fabricating a porous structure of a high refractive index material. The process 18 includes providing a void filled template of non-crosslinked polymer molecules, e.g., a template fabricated by process 10 of FIG. 1 (step 20). The process 18 includes forming a filled structure by filling the voids of the template with a high refractive index material (step 22). The filling is performed under low temperature conditions that neither damage the template nor crosslink polymer molecules of the template. Exemplary filling temperatures are below about 350° C. Next, the process 18 includes washing the structure with a solvent that solvates polymer molecules of the template (step 24). The solvated polymer molecules are washed away to produce a void-filled structure of the high refractive index material alone. Finally, the porous structure of the high refractive index material is dried to remove remaining solvent from the voids therein (step 26).

Figure 3:
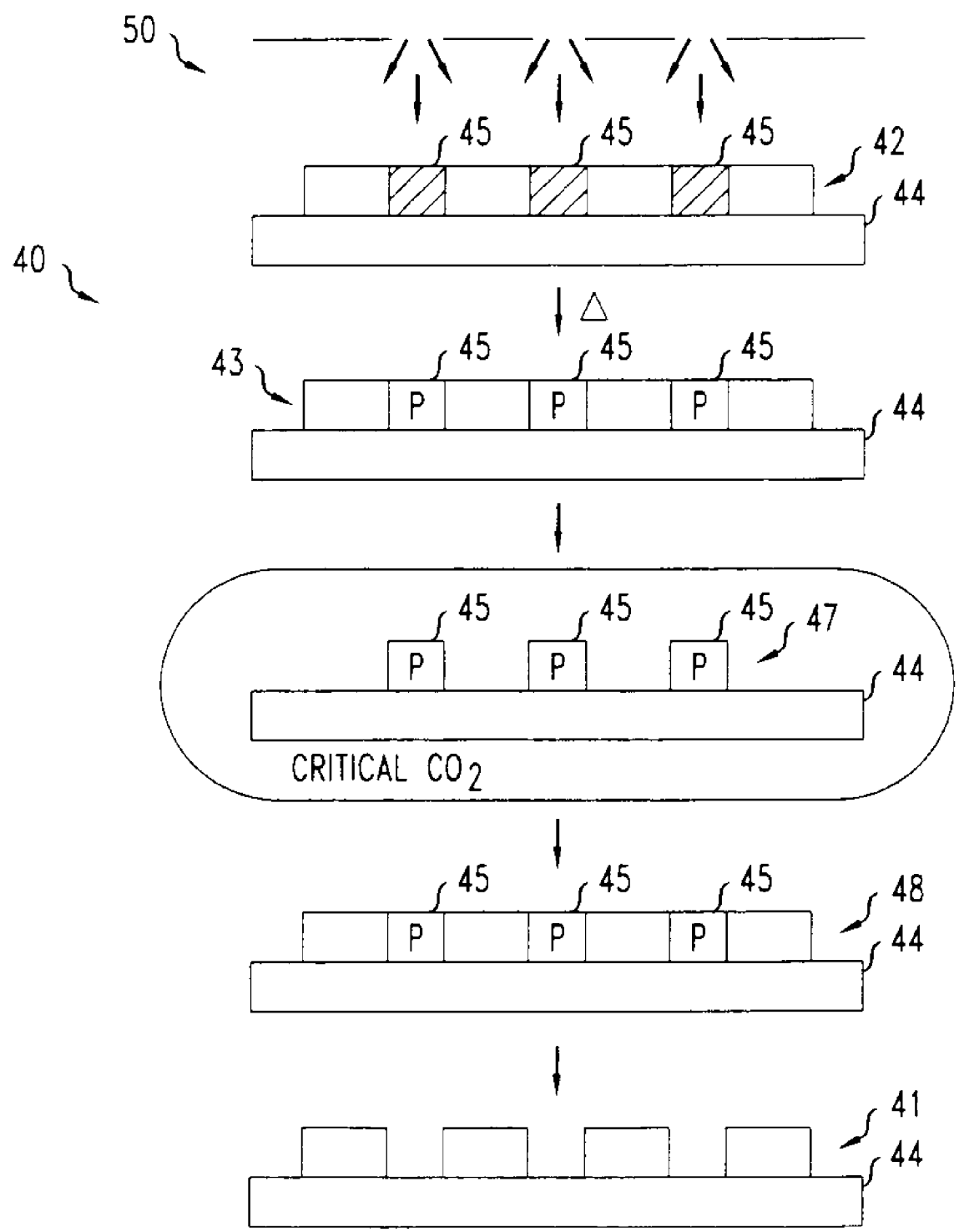
FIG. 3 illustrates a process that fabricates a porous structure of a high refractive index material by fabricating a negative tone polymer template.
Figure 4:
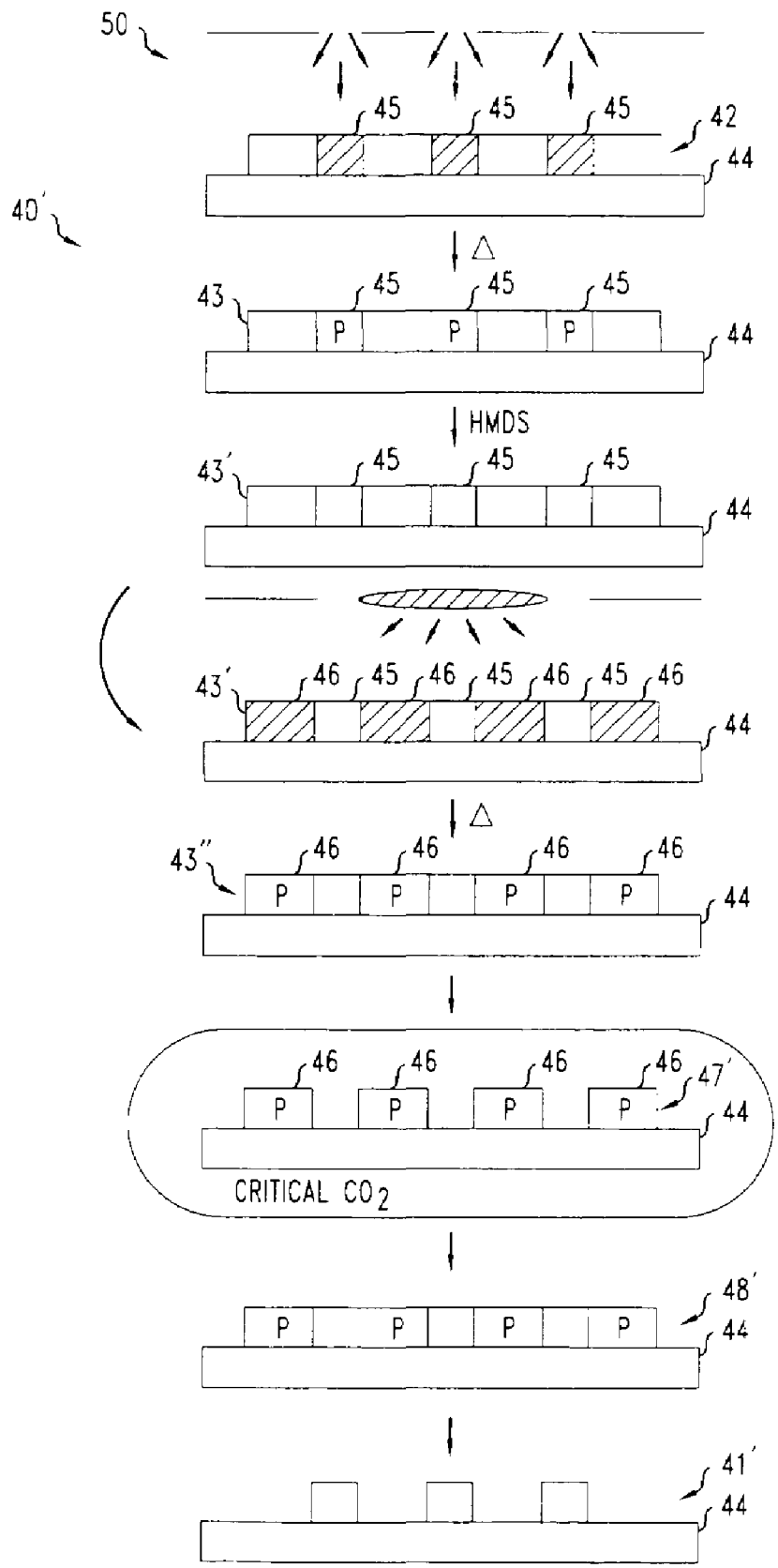
FIG. 4 illustrates a process that fabricates a porous structure of a high refractive index material by fabricating a positive tone polymer template.

FIGS. 3 and 4 illustrate specific embodiments 40, 40' for fabricating porous structures 41, 41' of a high index material according to the processes 10, 18 of FIGS. 1 and 2. The two porous structures 41 and 41' are positive and negative tone structures, respectively. Exemplary structures 41, 41' include photonic bandgap structures with high refractive index contrasts.

Processes 40 and 40' start with a layer of photoresist 42. The photoresist is supported on a substrate 44, e.g., a glass substrate. The photoresist 42 is a homogeneous mixture whose components include soluble polymer molecules, dye molecules, photoacid generator (PAG) molecules, and solvent. Exemplary components for the photoresist 42 are shown in FIGS. 5, 6A–6C, and 7A–7B.

Figure 5:
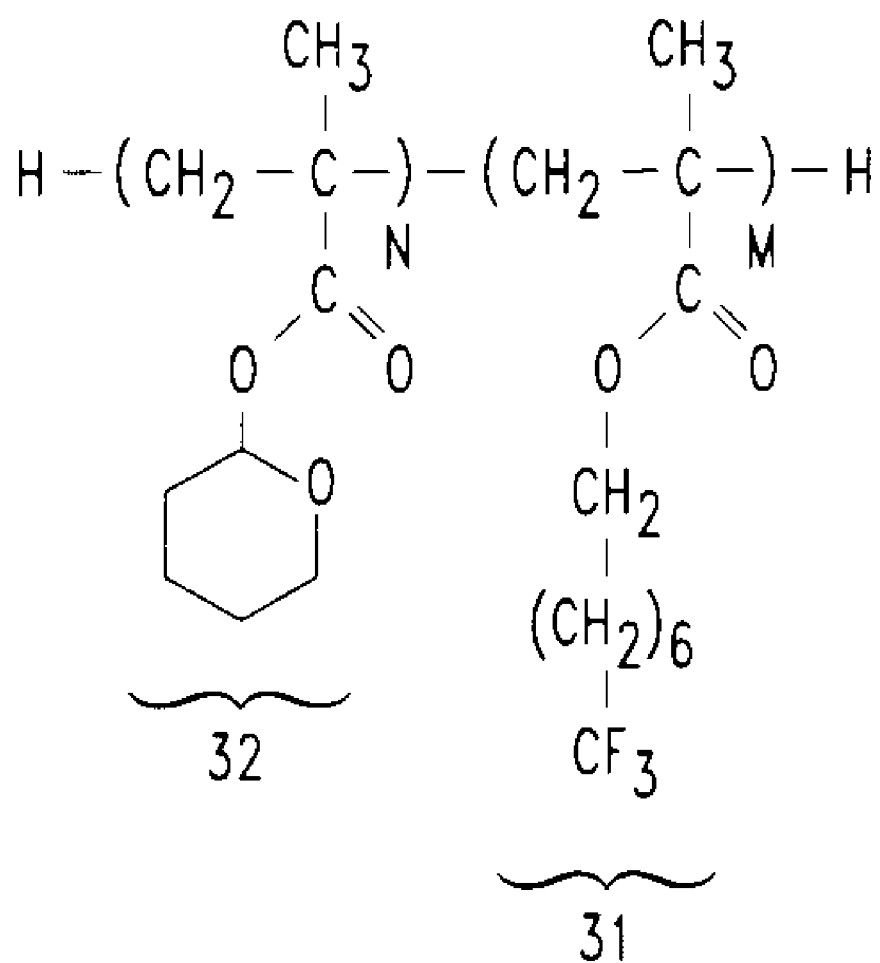
FIG. 5 shows an exemplary polymer molecule for the polymer photoresist used in the processes of FIGS. 3–4.

An exemplary polymer component for the photoresist 42 includes the polymer molecule 30 shown in FIG. 5. The polymer molecule 30 is a chain that includes M units of nonpolar fluorinated monomers 31 and N units of acid-sensitive monomers 32. The integers N and M are typically in the range of 10–1000 so that the polymer molecule 30 is soluble in nonpolar solvents. The fluorinated monomers 31 increase the solubility of the polymer molecule 30 in nonpolar solvents like fluid and supercritical carbon dioxide.

Figure 6A:
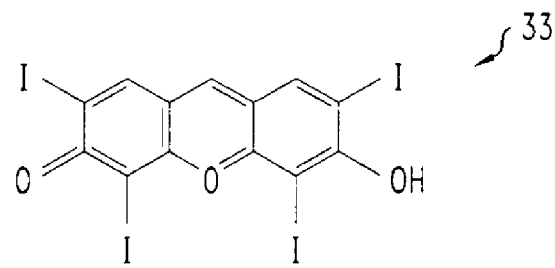
FIGS. 6A–6C show exemplary dye molecules for the polymer photoresist used in the processes of FIGS. 3–4.
Figure 6B:
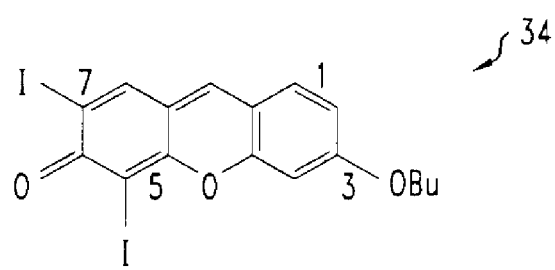
Figure 6C:
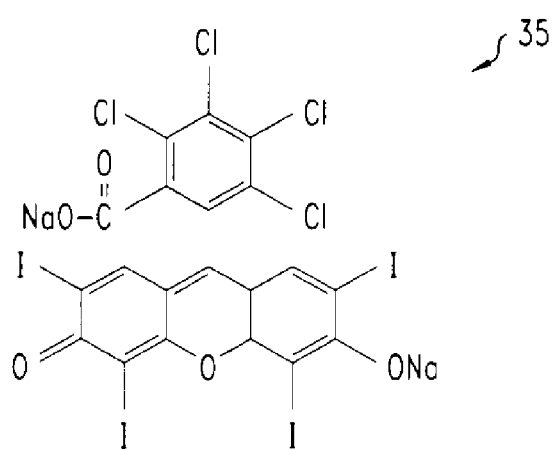

An exemplary dye component for the photoresist 42 includes one of the dye molecules 33, 34, 35 shown in FIGS. 6A–6C. The dye molecules 33, 34 are activated by visible light having wavelengths of about 535 nanometers (nm) and 470 nm, respectively. These dye molecules 33, 34 are available from Spectra Group Limited, Inc., 1722 Indian Wood Circle, Suite H Maumee, Ohio 43537 USA, under respective product names HNu-535 and HNu-470. The dye molecule 35 is activated by light with a wavelength of about 560 nm. The dye molecule is known as Rose Bengal and is available from Aldrich Company, P. O. Box 2060, Milwaukee, Wis. 53201 USA.

Figure 7A:
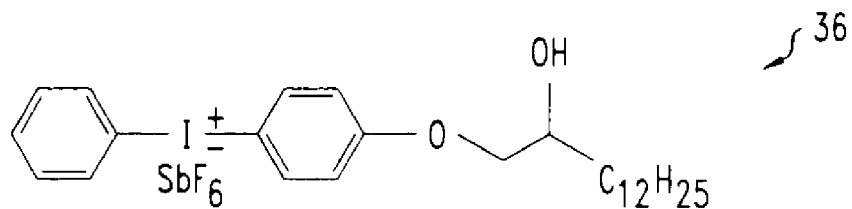
FIGS. 7A–7B show exemplary PAG molecules for the polymer photoresist used in the processes of FIGS. 3–4.
Figure 7B:
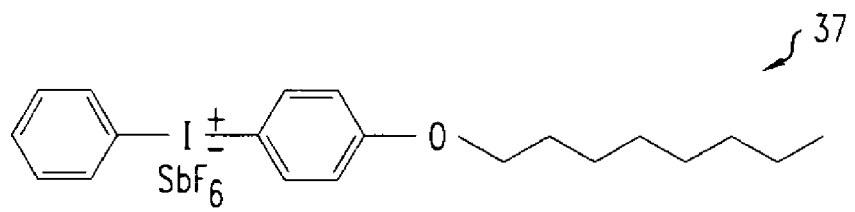

An exemplary PAG component for the photoresist 42 includes one of the molecules 36, 37 as shown in FIGS. 7A–7B. The PAG molecule 36 is available from Sartomer Inc., Oaklands Corporate Center, 502 Thomas Jones Way Exton, Pa. 19341 USA, under the product name SarCat® SR1012. The PAGM 37 is available from UCB Chemicals Corp., 2000 Lake Park Drive, Smyrna (Atlanta), Ga. 30080 USA, under the product name OPPI.

Exemplary solvents for the photoresist 42 include hydrocarbons, fluorinated hydrocarbons, and liquid and supercritical carbon dioxide.

Referring to FIG. 3, the fabrication process 40 includes exposing the photoresist 42 to a light pattern 50 (step 12). The light pattern produces an array of illuminated regions 45 in the photoresist 42. In the illuminated regions 45, a photoreaction sequence produces acid.

Figure 8:
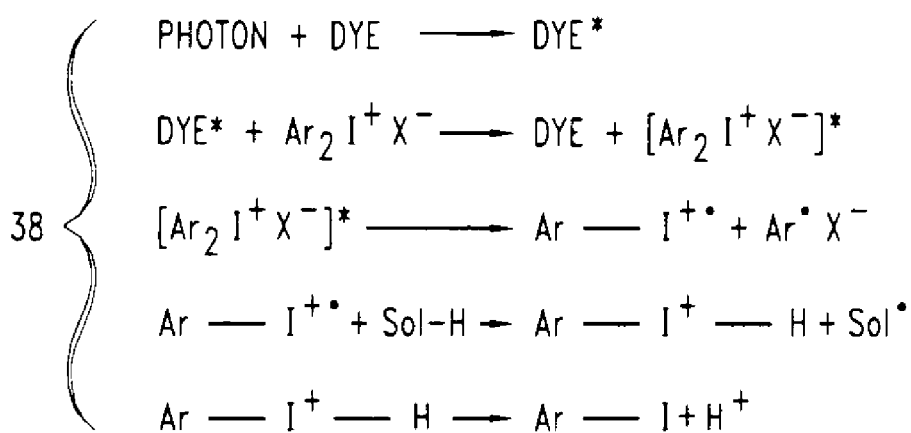
FIG. 8 illustrates the sequence of photoreactions in exemplary photoresists used in the processes of FIGS. 3–4.

FIG. 8 shows the photoreaction sequence 38 that occurs in illuminated regions 45 of the photoresist 42. In the photoreaction sequence 38, photons excite dye molecules (DYE*), which then excite PAG molecules ($Ar_2I^+ \ X^-$). The excited PAG molecules $Ar_2I^+ \ X^{-*}$ subsequently dissociate to produce free radicals $Ar\text{-}I^{+\cdot}$ and $Ar^{\cdot}X^-$. The free radicals $Ar\text{-}I^{+\cdot}$ react with solvent molecules (Sol-H) to produce hydronium ions $H^+$. The photoreaction sequence 38 is also described in the above-referenced '017 patent application.

The photoreaction sequence 38 does not produce changes to the refractive index in the illuminated regions 45 of the photoresist 49. Thus, the light pattern does not produce feedback, which could otherwise interfere with formation of the light pattern in the photoresist 42. For this reason, the exposure can be performed over an extended time period and produce an acid pattern that tracks a selected light pattern.

Referring again to FIG. 3, the fabrication process 40 includes baking the photoresist 42 to cause a reaction that changes the solubility of polymer molecules that are located in the previously illuminated regions 45 of the photoresist 42 (step 14). Photo-produced acid catalyzes the reaction, which generates polar functional groups on the polymer molecules located in the regions 45. The polar functional groups make the reacted polymer molecules of the baked photoresist 43 less soluble in nonpolar solvents.

Figure 9:
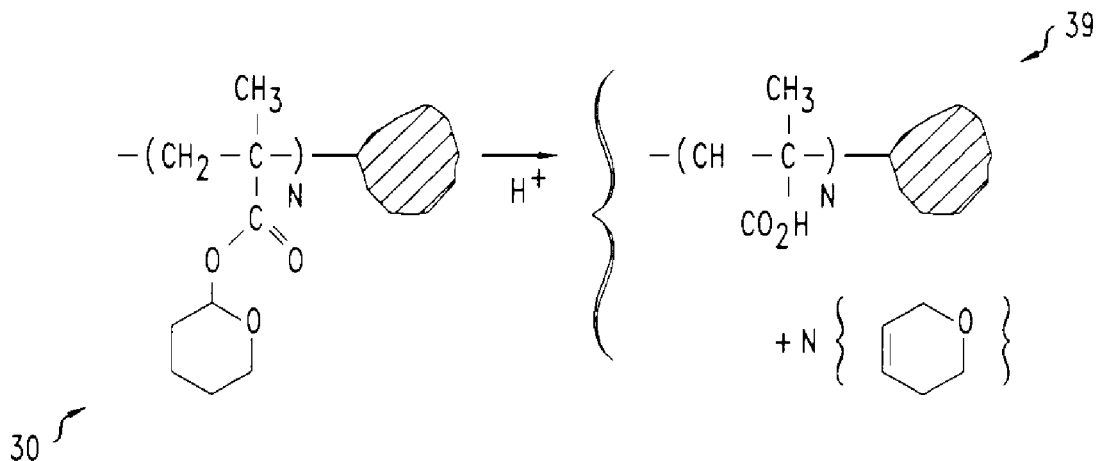
FIG. 9 shows an acid-catalyzed reaction of polymer molecules in the processes of FIGS. 3–4.

FIG. 9 shows an exemplary solubility changing reaction for the polymer molecule 30 shown in FIG. 5. The reaction is driven by $H^+$ ions and generates polar carboxylic acid groups, i.e., —$CO_2H$ groups, on the polymer molecules. Due to the carboxylic acid groups, the reacted polymer molecules 39 have lower solubilities in fluid or supercritical carbon dioxide.

Referring again to FIG. 3, the fabrication process 40 includes producing a void-filled template 47 by washing the baked photoresist 43 with a solvent that selectively solvates nonpolar polymer molecules (step 16). The washing step involves placing the photoresist 43 and supporting substrate 44 in a cell and filling the cell with liquid or supercritical carbon dioxide. The liquid or supercritical carbon dioxide diffuses into the photoresist 43 to replace the nonpolar solvent therein without causing drying. Since liquid or supercritical carbon dioxide is a nonpolar solvent, the diffusing carbon dioxide dissolves nonpolar, unreacted, polymer molecules without dissolving the polar, reacted, polymer molecules. Thus, the diffusion of the carbon dioxide selectively removes the unreacted polymer molecules to produce a void-filled template 47. Since the nonpolar polymer molecules are located outside of the previously illuminated regions 45, the template 47 is a negative tone structure.

The fabrication process 40 includes raising the pressure and temperature in the cell to values corresponding to the critical point of carbon dioxide. At the critical point conditions, the carbon dioxide is allowed to diffuse out of the template 47 thereby drying the template 47. The drying does not produce internal stresses, which could otherwise cause cracks, because critical carbon dioxide is a surface tension free fluid. Drying the template 47 in critical carbon dioxide minimizes the risk of damage due to internal surface tension forces.

The fabrication process 40 includes filling voids in the template 47 with a high refractive index material (step 22). The filling step is performed at a temperature below 350° C. and preferably below about 300° C. to avoid damaging polymer molecules, cross-linking of polymer molecules, or damaging the high refractive index material. The filling step produces filled structure 48, which includes non-crosslinked polymer molecules in regions 45 and high refractive index material elsewhere.

A variety of processes are available to fill the voids of the template 47 with a high refractive index material. Exemplary fill steps include melting a high refractive index material with a low melting temperature, e.g., selenium or bismuth, and filling the melted material into the voids of the template 47 under pressure. Other exemplary fill steps include subliming a high refractive index material having a low vaporization temperature into the voids of the template 47. Other exemplary fill steps include performing a gas-phase reaction that deposits a high refractive index byproduct in the voids of the template 47.

The fabrication process 40 also includes washing the filled structure 48 to dissolve away the polymer molecules of the original template 47 to produce a porous structure 41 of the high refractive index material and then drying the structure (steps 24 and 26). The washing step produces a porous structure of the high refractive index material alone. For the polar polymer molecules 39 shown in FIG. 7, a basic aqueous solution is a suitable solution for the washing step.

FIG. 4 illustrates the alternate process 40' for fabricating porous structure 41' of high index material. The process 40' includes performing steps 12 and 14 to produce the baked photoresist 43 as already described with respect to process 40 of FIG. 3. In the baked photoresist 43, the reacted polymer molecules in regions 45 are insoluble in a nonpolar solvent. As an example, the reacted polymer molecule 39 of FIG. 8 is insoluble in nonpolar solvents due to the polar carboxylic acid groups produced by the chemical reaction of step 14.

The process 40' includes performing a vapor-phase reaction to change the solubility of a portion of the polymer molecules of the photoresist 43. The vapor-phase reaction produces a photoresist 43' in which the polymer molecules located in the regions 45 have a changed solubility. The reaction causes these previously reacted polymer molecules to become more soluble in nonpolar solvents such as liquid or supercritical carbon dioxide.

Figure 10:
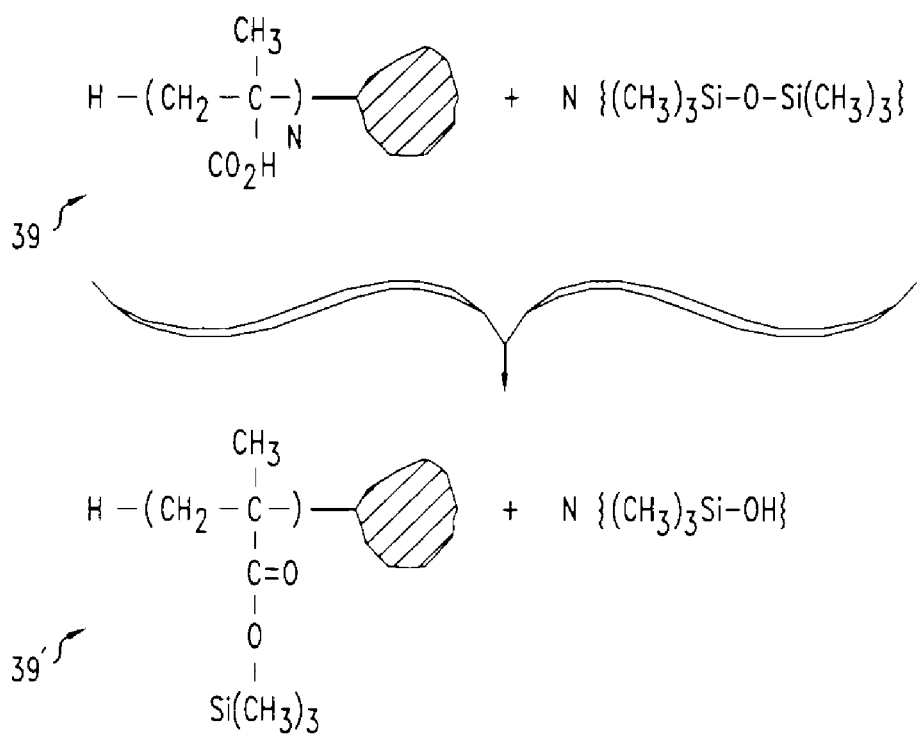
FIG. 10 shows a reaction that changes the solubility of polymer molecules previously modified by the acid-catalyzed reaction shown in FIG. 9.

FIG. 10 shows an exemplary vapor-phase reaction for changing the solubility of the polymer molecule 39 of FIG. 9. The reaction is a hydrosilylation in which $(CH_3)_3SiOSi(CH_3)_3$ (HMDS) reacts with carboxylic acid groups on the polymer molecule 39 to produce less polar functional groups. The hydrosilylation reaction changes the solubility of the previously reacted polymer molecules. In particular, the reaction caps the polar carboxylic acid groups to make molecule 39' significantly more soluble in nonpolar solvents than the original molecule 39.

Referring again to FIG. 4, the process 40' includes uniformly illuminating the photoresist 43' to generate acid in regions 46 via the photo-reaction sequence 38 of FIG. 8. Then, a rebake step causes the photo-produced acid to catalyze a reaction in the polymer molecules that are located in the regions 46 of the photoresist 43". The reaction changes the solubility of said polymer molecules, which were not previously exposed by the nontrivial light pattern.

From the exemplary nonpolar polymer molecules 30, shown in FIG. 9, the rebake produces the polar molecules 39. The rebake does not crosslink polymer molecules or cause hydrosilylated polymer molecules in the previously reacted regions 45 of the photoresist 43' to further react.

The process 40' also includes producing a void-filled polymer template 47' by washing the rebaked photoresist 43" with fluid or supercritical carbon dioxide as already described with respect to above process 40 (step 16). The wash dissolves away the nonpolar polymer molecules that located in regions 45 thereby producing a positive tone structure in polymer template 47'. Combining the vapor-phase reaction, uniform illumination, and rebake inverted the spatial distribution of molecules soluble in polar and nonpolar solvents, respectively, to produce a positive tone template 47' rather than the negative tone template 47 of FIG. 3.

The fabrication process 40' also includes filling voids in the template 47' with a high refractive index material to produce filled structure 48' in a manner already described with respect to process 40 (step 22). The filled structure 48' is then washed with a solvent that solvates the non-crosslinked polymer molecules of the template 47' to produce the porous structure of the high refractive index material (step 24).

The porous structure is dried to produce the final void-filled structure 41' of the high refractive index material (step 26). The final void-filled structure 41' of the high refractive index material is a positive tone structure.

From the disclosure, drawings, and claims, other embodiments of the invention will be apparent to those skilled in the art.

What is claimed is:

1. A process, comprising:
    exposing a polymer photoresist to a light pattern to generate acid in illuminated regions of the photoresist;
    baking the photoresist to cause polymer molecules located in the illuminated regions to react with the acid and become less soluble in a nonpolar solvent without being crosslinked;
    reacting the baked photoresist with a reagent that causes the previously reacted polymer molecules to become more soluble in the nonpolar solvent; and
    re-exposing the photoresist to light and rebaking the photoresist to cause unreacted polymer molecules of the photoresist to become less soluble in the nonpolar solvent; and
    washing the baked photoresist in a nonpolar solvent to produce voids in the baked photoresist by selectively solvating the reacted polymer molecules.

2. The process of claim 1, wherein the baking produces carboxylic acid groups on the reacted polymer molecules.

3. The process of claim 1, wherein the rebaking produces carboxylic acid groups on the unreacted polymer molecules.

4. The process of claim 1, wherein the washing includes immersing the rebaked photoresist in critical carbon dioxide.

5. A process, comprising:
    exposing a photoresist comprising polymer molecules to a light pattern;
    baking the photoresist to make ones of the polymer molecules that were exposed to light of the pattern less soluble in a solvent;
    reacting the baked photoresist with a reagent to make the ones of the polymer molecules more soluble in the solvent; and
    re-exposing the photoresist to light and rebaking the photoresist to make others of the polymer molecules that were not exposed to light of the pattern less soluble in the solvent; and
    washing the baked photoresist with the solvent to produce voids in the baked photoresist by selectively solvating the ones of the polymer molecules that were exposed to light of the pattern.

6. The process of claim 5, wherein the solvent is a nonpolar fluid.

7. The process of claim 6, wherein the baking generates a carboxylic acid group on the ones of the polymer molecules that were exposed to light of the pattern.

8. The process of claim 5, wherein the baking does not crosslink the polymer molecules.

9. The process of claim 5, wherein the washing comprises immersing the photoresist in fluid carbon dioxide.

10. The method of claim 5, wherein the reacting step includes performing a hydrosilylation reaction on the ones of the polymer molecules that were exposed to light of the pattern.

11. The process of claim 5, wherein the baking is performed at a temperature of less than about 350° C.

12. The process of claim 5, wherein the baking makes the ones of the polymer molecules insoluble in the solvent and the rebaking makes the others of polymer molecules insoluble in the solvent.

* * * * *